United States Patent
Wada et al.

[11] Patent Number: 5,858,121
[45] Date of Patent: Jan. 12, 1999

[54] THIN FILM SOLAR CELL AND METHOD FOR MANUFACTURING THE SAME

[75] Inventors: Takahiro Wada, Osaka; Mikihiko Nishitani, Nara; Naoki Kohara, Osaka, all of Japan

[73] Assignee: Matsushita Electric Industrial Co., Ltd., Osaka, Japan

[21] Appl. No.: 712,025

[22] Filed: Sep. 11, 1996

[30] Foreign Application Priority Data

Sep. 13, 1995 [JP] Japan .................................. 7-235828

[51] Int. Cl.[6] .................................. H01L 31/272
[52] U.S. Cl. .................... 136/265; 438/95; 136/264
[58] Field of Search .................... 136/265, 264; 438/95

[56] References Cited

U.S. PATENT DOCUMENTS

| | | | |
|---|---|---|---|
| 5,141,564 | 8/1992 | Chen et al. | 136/258 |
| 5,356,839 | 10/1994 | Tuttle et al. | 437/225 |
| 5,441,897 | 8/1995 | Noufi et al. | 437/5 |
| 5,626,688 | 5/1997 | Probst et al. | 136/265 |

OTHER PUBLICATIONS

Rockett, et al., "CuInSe$_2$ for photovoltaic applications", *J. Appl. Phys.*, vol. 70 No. 7, Oct. 1991.

Schock, "CuInSe$_2$ and Other Chalcopyright–Based Solar Cells", *MRS Bulletin*, Oct. 1993, pp. 42–44.

Tuttle, et al., "Structure, chemistry, and growth mechanisms of photovoltaic quality thin–film Cu(In,Ga)Se$_2$ grown from a mixed–phase precusor", *J. Appl. Phys.*, vol. 77, No. 1, Jan. 1995, pp. 153–161.

J. Shewchun et al, *Conference Record, 14$^{th}$ IEEE Photovoltaic Specialists Conf.* (1980), pp. 650–655.

*Primary Examiner*—Nam Nguyen
*Attorney, Agent, or Firm*—Merchant, Gould, Smith, Edell, Welter & Schmidt, P.A.

[57] ABSTRACT

A thin film solar cell having high conversion efficiency is provided. The band gap of the thin film solar cell can be controlled while keeping the quality superior to conventional solar cells. The absorber layer for photovoltaic energy conversion is a Cu(In$_{1-X}$Ga$_X$)(Se$_{1-Y}$S$_Y$)$_2$ based solid solution where X and Y are in the range of the following Equation:

$$0.317 + 0.176Y \geq X \geq 0.117 + 0.176Y$$

$$1 > X + Y > 0$$

$$Y > 0,$$

The Cu(In$_{1-X}$Ga$_X$)(Se$_{1-Y}$S$_Y$)$_2$ based solid solution has a specific chalcopyrite type crystal structure and its lattice constant ratio of c-axis to a-axis is extremely close to two. It is most preferable that the band gap is 1.4 eV, X is 0.3, and Y is 0.4, since the conversion efficiency of a homojunction solar cell will then become a maximum.

9 Claims, 7 Drawing Sheets

THIN FILM SOLAR CELL AND METHOD FOR MANUFACTURING THE SAME

FIELD OF THE INVENTION

This invention relates to a thin film solar cell comprising a I-III-IV$_2$ type compound semiconductor for its absorber layer.

BACKGROUND OF THE INVENTION

A thin film of a I-III-IV$_2$ type compound whose band gap ranges from 1.0 to 1.8 eV, such as CuInSe$_2$, is used as an absorber layer in solar cells. Multi-source evaporation and selenization are known as methods for forming a CuInSe$_2$ thin film (cf. A. Rockett and R. W. Birkmire, *J. Appl. Phys.* Vol.70, No.7, p.81). In the multi-source evaporation, a CuInSe$_2$ film is formed on a heated substrate by evaporating the elements (Cu, In, and Se) from the respective evaporation sources. Several well-known evaporation processes, which provide highly efficient solar cells, include a process for forming a Cu—In—Se film in a Cu-rich composition (Cu/In>1). The reason is as follows. If a thin film is formed on a substrate at a temperature of at least 500° C. in a Cu-rich condition for the composition, Cu—Se based impurities are deposited as well as the CuInSe$_2$. The Cu—Se based impurities function as a flux, and thus the crystal particles of the CuInSe$_2$ grow bigger. In another case, the band gap (Eg) of the CuInSe$_2$ (absorber layer) is made closer to the best value for absorption of sun light (1.4 eV), so that the efficiency of the solar cell is improved. In general, the band gap of the absorber layer is increased by dissolving CuGaSe$_2$ (Eg=1.68 eV) in the CuInSe$_2$ (Eg=1.0 eV).

When Cu(In$_{1-X}$Ga$_X$)Se$_2$ solid solution is used for an absorber layer, the band gap will be enlarged as the quantity of Ga solid solution (X) rises. The conversion efficiency of the solar cell, however, does not increase so easily even if the solid solution thin film is used for the absorber layer. The conversion efficiency is maximum when the quantity (X) of Ga is about 0.2 to 0.3 (Eg=about 1.15 eV). The conversion efficiency, however, starts lowering if the value (X) continues to rise (cf. H. W. Schock, *MRS BULLETIN*, Vol.18, No.10, p.42–44). This phenomenon is caused, probably, by the deterioration of the crystal property of the Cu(In$_{1-X}$Ga$_X$)Se$_2$ solid solution thin film in a Ga-rich region.

SUMMARY OF THE INVENTION

In order to solve these and other problems, this invention aims to provide a thin film solar cell having high conversion efficiency. The absorber layer of the solar cell is a CuInSe$_2$ based compound semiconductor thin film which permits band gap control while keeping its quality.

For the present purposes, a solar cell of this invention comprises a photovoltaic energy conversion absorber layer of Cu(In$_{1-X}$Ga$_X$)(Se$_{1-Y}$S$_Y$)$_2$, and X and Y of the formula are in the range of the following Equation (1):

$$0.317 + 0.176Y \geq X \geq 0.117 + 0.176Y \quad (1)$$

$$1 > X + Y > 0$$

$$Y > 0$$

It is preferable that X and Y of the formula of the absorber layer Cu(In$_{1-X}$Ga$_X$)(Se$_{1-Y}$S$_Y$)$_2$ are in the range indicated in the following Equation (2).

$$X = 0.217 + 0.176Y \quad (2)$$

$$1 > X + Y > 0$$

$$Y > 0$$

It is specifically preferable in the absorber layer Cu(In$_{1-X}$Ga$_X$)(Se$_{1-Y}$S$_Y$)$_2$ that X=0.3, and Y=0.4.

It is preferable that the absorber layer Cu(In$_{1-X}$Ga$_X$)(Se$_{1-Y}$S$_Y$)$_2$ is has a chalcopyrite type crystal structure where the lattice constant ratio of the a-axis to the c-axis is about two. More specifically, the ratio ranges from 2.01 to 1.99.

A first method for manufacturing a thin film solar cell of this invention comprises formation of an absorber layer Cu(In$_{1-X}$Ga$_X$)(Se$_{1-Y}$S$_Y$)$_2$ is by evaporating Cu, Ga, In, Se and S, where X and Y are indicated by Equation (1).

A second method for manufacturing a thin film solar cell of this invention comprises formation of an absorber layer Cu(In$_{1-X}$Ga$_X$)(Se$_{1-Y}$S$_Y$)$_2$ is by evaporating Cu, Ga, In, Se, and an In sulfide, where X and Y are indicated by Equation (1).

It is preferable in the second method that the In sulfide is In$_2$S$_3$.

A third method for manufacturing a thin film solar cell of this invention comprises formation of an absorber layer Cu(In$_{1-X}$Ga$_X$)(Se$_{1-Y}$S$_Y$)$_2$ is by evaporating Cu, Ga, In, Se, and a Ga sulfide, where X and Y are indicated by Equation (1).

It is preferable in the third method that the Ga sulfide is GaS.

According to this invention, excellent crystal properties are maintained even if the band gap of the CuInSe$_2$ based compound semiconductor thin film for the absorber layer is controlled in a wide range, so that a high conversion efficiency is achieved.

BRIEF DESCRIPTION OF THE DRAWINGS

FIG. 1A is the bright field image and FIG. 1B is the dark field image.

DETAILED DESCRIPTION OF THE INVENTION

Figure 1A:
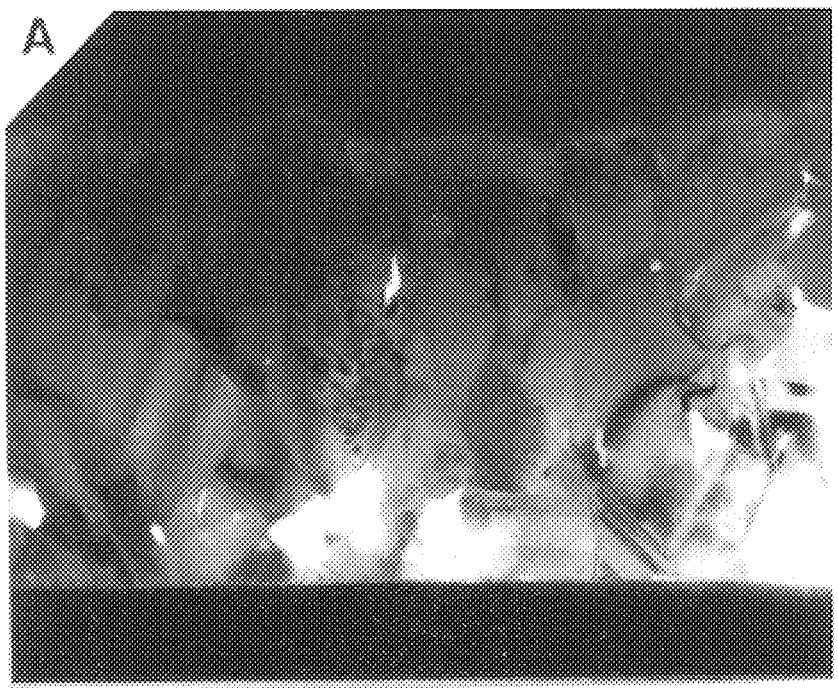
FIGS. 1A and 1B are transmission electron microscope (TEM) pictures showing cross sections of a solar cell having an absorber layer of CuInSe$_2$ thin film formed by a multi-source evaporation of one embodiment of this invention.
Figure 1B:
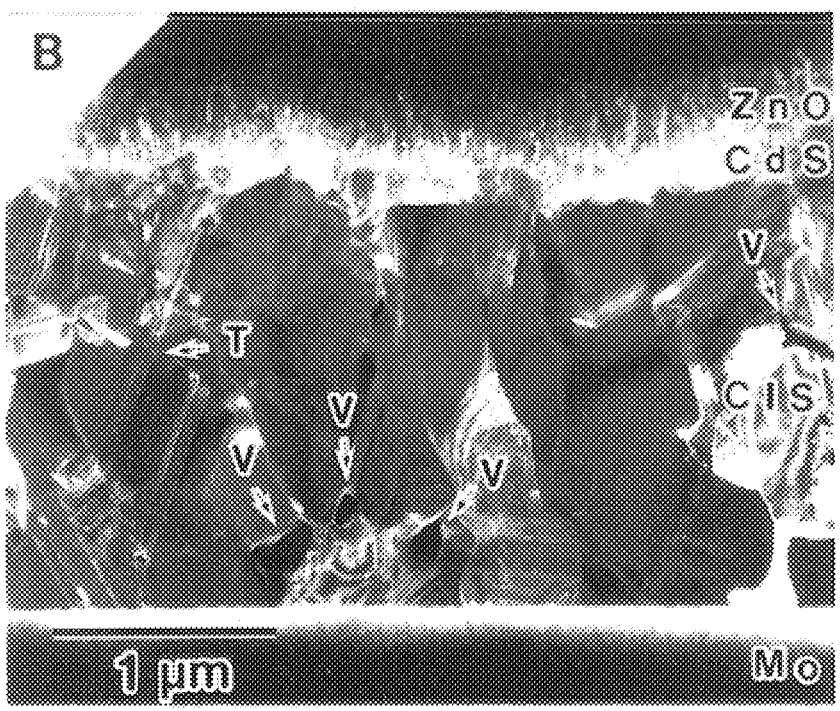

The conversion efficiency of a solar cell is improved by using a Cu(In$_{1-X}$Ga$_X$)Se$_2$ based solid solution for its absorber layer. When the quantity of Ga solid solution (X)

exceeds the range from 0.2 to 0.3 (Eg=about 1.15 eV), however, the conversion efficiency lowers. In order to examine how this phenomenon is caused, the microstructures of the cross sections of the CuInSe$_2$ based absorber layers having varied compositions were observed by using TEM. FIGS. 1A and 1B are TEM pictures showing cross sections of a solar cell provided with an absorber layer of a CuInSe$_2$ (CIS) thin film which is formed by a multi-source evaporation. The solar cell is formed by sequentially laminating ITO, ZnO, CdS, CIS, molybdenum (Mo), and glass. Here, CIS indicates CuInSe$_2$, and ITO is a transparent conductive film of, for example, indium-tin oxide alloy. ZnO/CdS is a buffer layer consisting of a ZnO layer and a CdS layer. CIS is an absorber layer and Mo is a back contact. These TEM pictures show that a lot of twin crystals or stacking faults exist in the absorber layer. Such a lattice defect is indicated with a mark T. Mark V indicates a void. These defects can have a bad influence on the performance of the solar cell.

Figure 2:
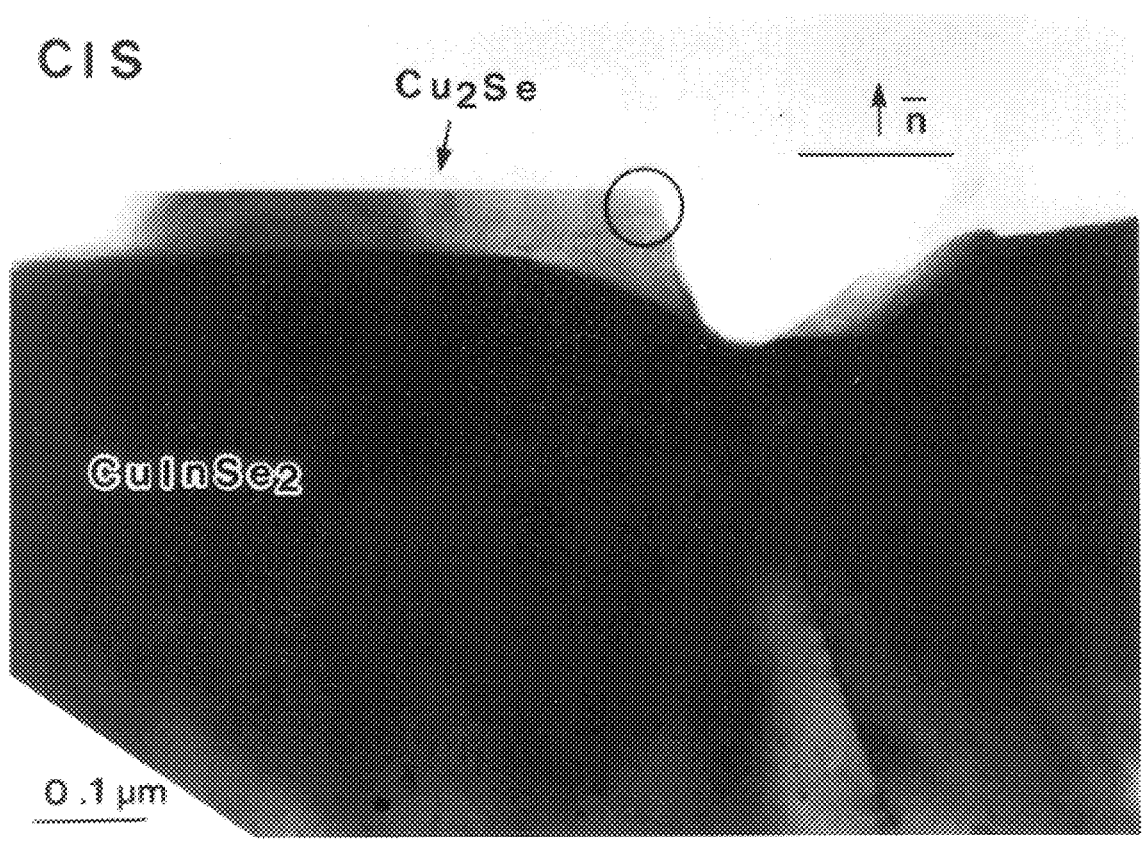
FIG. 2 is a TEM picture showing a cross section of the portion near the surface of the Cu-rich composition CuInSe$_2$ thin film sample of another embodiment of this invention.

In the next step, a Cu-rich composition CuInSe$_2$ thin film formed by the multi-source evaporation was analyzed to see why such crystal defects of the CuInSe$_2$ were created. In the multi-source evaporation, the Cu—In—Se film formation under the Cu-rich composition condition is an important process to make the CuInSe$_2$ crystal particles bigger. Therefore, the process should be observed carefully to clarify how the CuInSe$_2$ thin film is formed. The composition of the Cu-rich composition film was analyzed by using an electron probe microanalyzer (EPMA). The ratio was as follows. Cu:In:Se=43.6:12.1:44.3 (atomic %). When the composition is expressed with Cu$_2$Se and CuInSe$_2$, the ratio becomes as follows. Cu$_2$Se:CuInSe$_2$=5:4, namely, Cu was contained quite excessively in the sample. FIG. 2 is a TEM picture showing the cross section of a portion near the surface of this sample. Identification of each phase was conducted by using the EPMA. In FIG. 2, the direction perpendicular to the substrate was indicated by $\uparrow\bar{n}$. It is clear from FIG. 2 that the segregated Cu$_2$Se exists on the surface of the CuInSe$_2$.

Figure 3A:
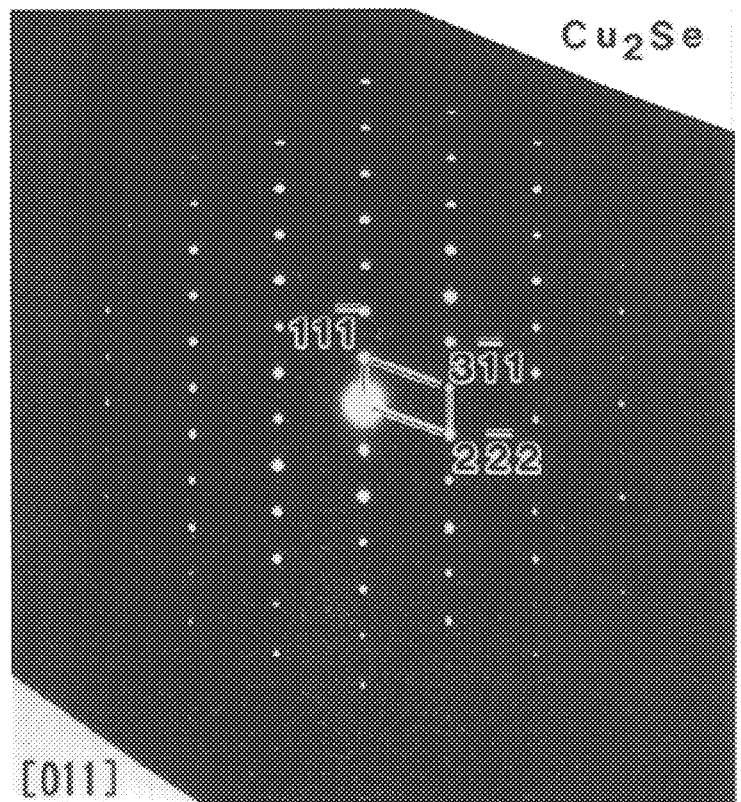
FIGS. 3A and 3B show electron beam diffraction patterns of the Cu$_2$Se part and the CuInSe$_2$ part of the TEM picture respectively (FIG. 2).
Figure 3B:
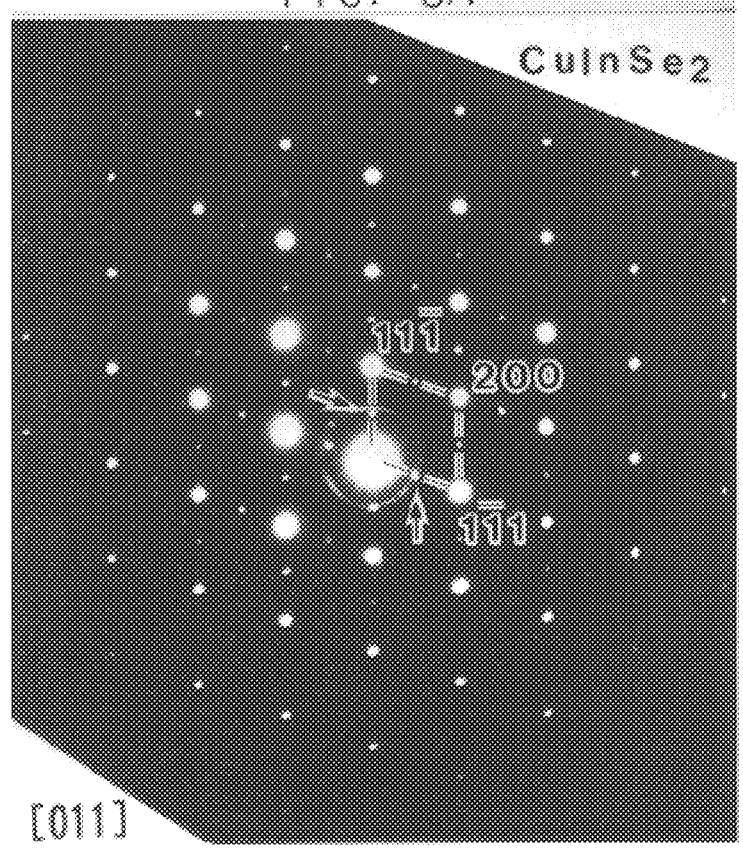

FIGS. 3A and 3B respectively indicate the electron beam diffraction patterns of the Cu$_2$Se part and that of the CuInSe$_2$ part of the cross-sectional TEM picture (FIG. 2). Though the sample was displaced a little during the measurements, it was not inclined. Therefore, the orientations of their electron diffraction patterns accord with each other. The electron beam diffraction pattern of the above-mentioned Cu$_2$Se was indexed based on the structural parameter of a pseudo-cubic system (a=11.6 angstroms (1.16 nm)), more precisely, a tetragonal system (a=11.52 angstroms (1.152 nm), c=11.74 angstroms (1.174 nm)). The zone axis is [011] axis. The electron beam diffraction pattern of the above-mentioned CuInSe$_2$ (FIG. 3B) was indexed based on the structural parameter of a sphalerite phase (a=5.78 angstroms (0.578 nm)) of a tetragonal system. The zone axis is [011] axis, too. The arrows indicate the diffraction points corresponding to the {1/2, 1/2, 1/2} reflections, which are not found in either the sphalerite phase or the chalcopyrite phase. In general, these diffraction points are found in a CuPt phase.

It is clear from the comparison between the electron beam diffraction patterns of Cu$_2$Se and of CuInSe$_2$, that the [011] axis orientation of Cu$_2$Se and that of CuInSe$_2$ are parallel. In addition, the <11$\bar{1}$> direction of Cu$_2$Se and <11$\bar{1}$> direction of CuInSe$_2$, and the <2$\bar{2}$2> direction of Cu$_2$Se and <1$\bar{1}$1> direction of CuInSe$_2$ accord with each other. Therefore, the (111) faces of Cu$_2$Se and CuInSe$_2$ are parallel. Namely, the orientation relationship can be described in the following Equation (3).

[011], (11$\bar{1}$) CuInSe$_2$ ∥ [011], (11$\bar{1}$) Cu$_2$Se  (3)

Figure 4:
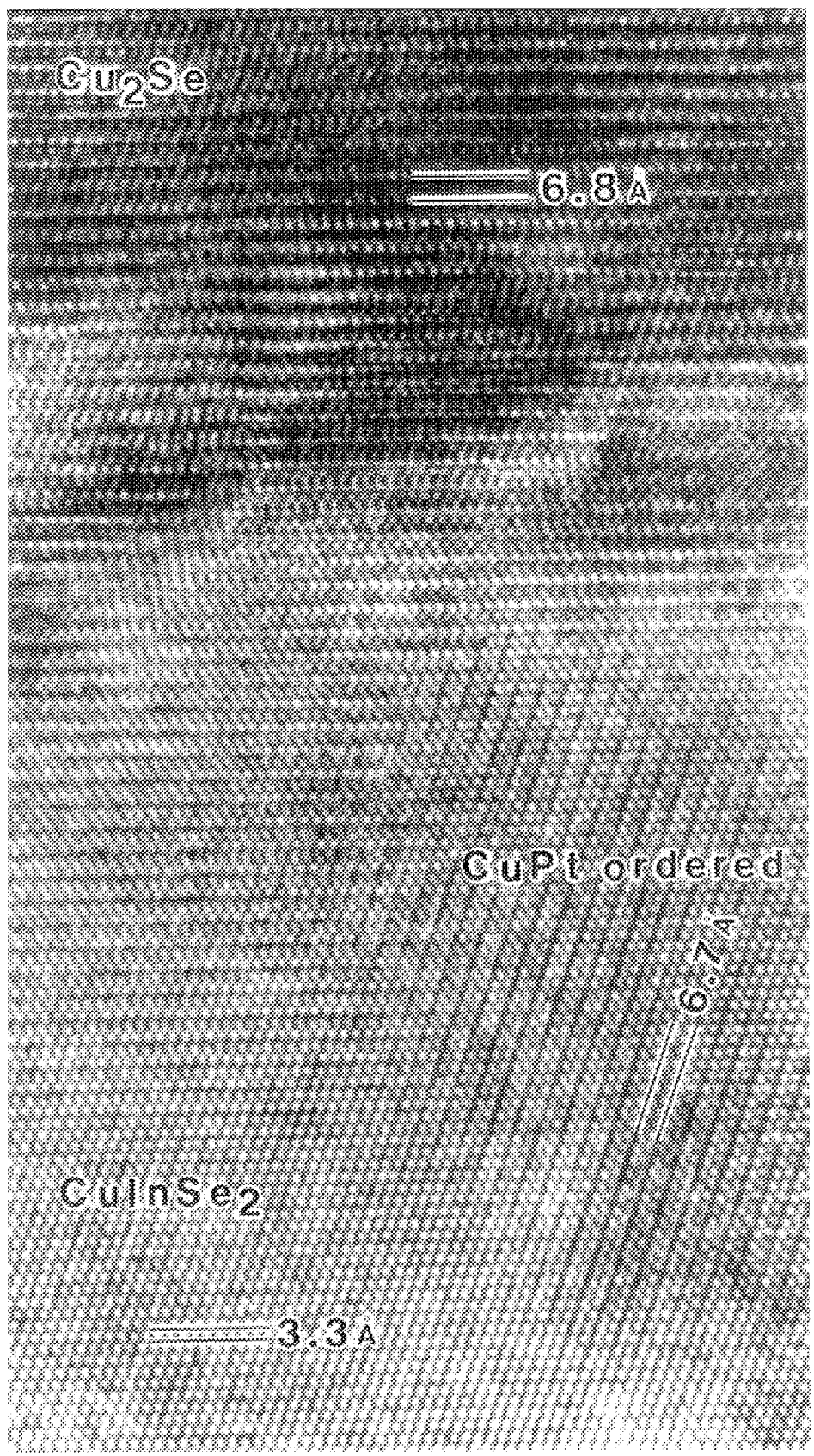
FIG. 4 is a high resolution TEM picture showing the portion near the interface of the segregated Cu$_2$Se phase and the CuInSe$_2$ phase of one embodiment of this invention.

FIG. 4 is a high-resolution TEM picture showing a portion near the interface of the segregated Cu$_2$Se phase and CuInSe$_2$ phase. The Cu$_2$Se phase exists around the surface while the CuInSe$_2$ phase exists on the substrate side. In FIG. 4, a lattice image of 6.8 angstroms (0.68 nm) intervals specific to the Cu$_2$Se phase and a lattice image of 3.3 angstroms (0.33 nm) intervals specific to the CuInSe$_2$ phase are clearly shown. The lattice image of the CuInSe$_2$ phase having 3.3 angstroms (0.33 nm) intervals is seen at the bottom of FIG. 4. In the middle of these phases, there is a portion of 6.7 angstrom (0.67 nm). The intermediate portion is a CuPt phase. In the electron beam diffraction patterns (FIGS. 3A and 3B), diffraction points corresponding to {1/2, 1/2, 1/2} reflections are found. Such reflections are not seen either in a sphalerite phase (CuPt phase) or in a chalcopyrite phase.

Figure 5:
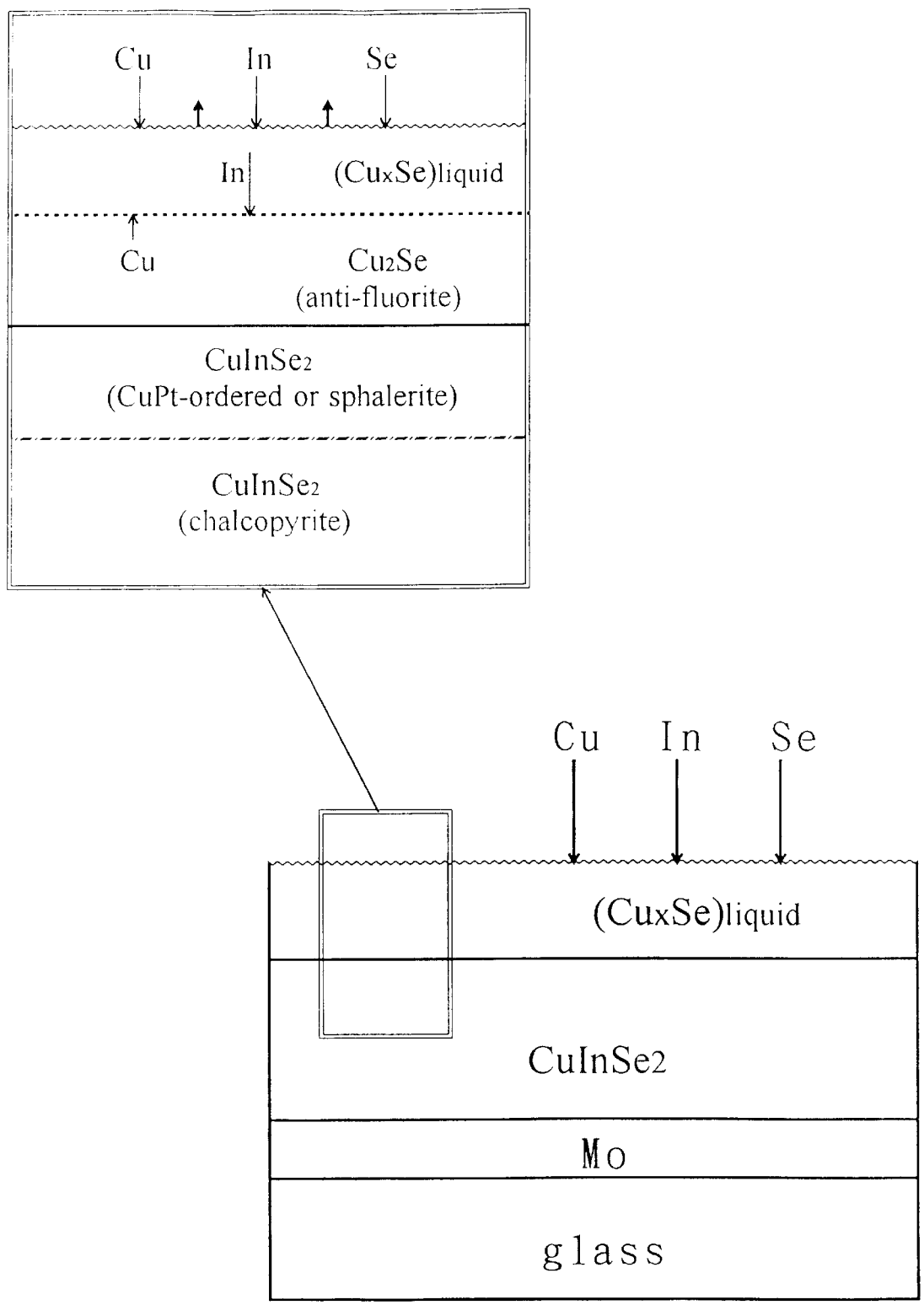
FIG. 5 is a diagram showing the concept of the system of the CuInSe$_2$ thin film growth in the multi-source evaporation of one embodiment of this invention.

These observation results clearly indicate the mechanism of the CuInSe$_2$ thin film growth in a multi-source evaporation. The concept is shown in FIG. 5. CuInSe$_2$ crystals basically grow through the Cu—Se based liquid layer on the thin film. It was believed that the chalcopyrite type CuInSe$_2$ crystals grew directly from the Cu—Se based liquid layer (cf. J. R. Tuttle etc., *J. Appl. Phys.* Vol.77, No.1, p.153–161). Actually however, the Cu—Se based liquid layer co-exists with the Cu$_2$Se solid phase as shown in the enlarged view of the thin film surface (FIG. 5). The Cu$_2$Se solid phase and In diffused from the surface react with each other, and thus CuInSe$_2$ is generated. CuInSe$_2$ of CuPt phase or sphalerite phase (metastable phases) is first generated from Cu$_2$Se. The metastable phases gradually change to CuInSe$_2$ of chalcopyrite phase (stable phase).

Both FIGS. 3(A, B) (the electron beam diffraction pattern) and FIG. 4 (high-resolution TEM picture) indicate that there is a three-dimensional crystal orientation relationship between the Cu$_2$Se (the starting material) and the generated CuInSe$_2$ (the product). Such a chemical reaction is called a Topotactic Reaction. The fact that the crystal structures of the Cu$_2$Se and the CuInSe$_2$ are so similar to each other is important for the Topotactic Reaction. If Cu$_2$Se, which is based on an anti-fluorite structure, changes to CuInSe$_2$ having sphalerite structure, the Se location of the compounds, namely, the cubic closest packing structure of Se, does not change.

It is CuInSe$_2$ of sphalerite phase or of CuPt phase that is generated first from Cu$_2$Se. The CuInSe$_2$ of these phases have the isotropic crystal structure. Such metastable phases having isotropic crystal structures change into CuInSe$_2$ of a stable chalcopyrite phase. The CuInSe$_2$ of the chalcopyrite phase is a tetragonal system. Its a-axis is 5.782 angstroms (0.5782 nm), and c-axis is 11.619 angstroms (1.1619 nm) long. The ratio of the c-axis to the a-axis is 2.0095, namely, the crystals have an anisotropic structure.

It has been found that crystal defects are generated when the CuInSe$_2$ of isotropic sphalerite phase or of CuPt phase changes to that of chalcopyrite type CuInSe$_2$ having anisotropic crystal structure (cf. the cross-sectional TEM of FIG. 1). In view of this fact, it is possible to reduce crystal defects including twin crystals and stacking faults by decreasing the anisotropy of the apparent crystal structure of the CuInSe$_2$. For this purpose, the composition of the CuInSe$_2$ will be controlled to make the ratio of the axes (a/c) closer to two.

Table 1 shows the lattice constant, ratio of c-axis to a-axis, and the band gap respecting to CuInSe$_2$ and its related compounds.

TABLE 1

| Formulas | Eg(eV) | a(angstroms) | c(angstroms) | c/a |
|---|---|---|---|---|
| $CuInSe_2$ | 1.04 | 5.782 | 11.619 | 2.0095 |
| $CuGaSe_2$ | 1.68 | 5.612 | 11.032 | 1.9657 |
| $CuInS_2$ | 1.53 | 5.523 | 11.141 | 2.0172 |

Figure 6:
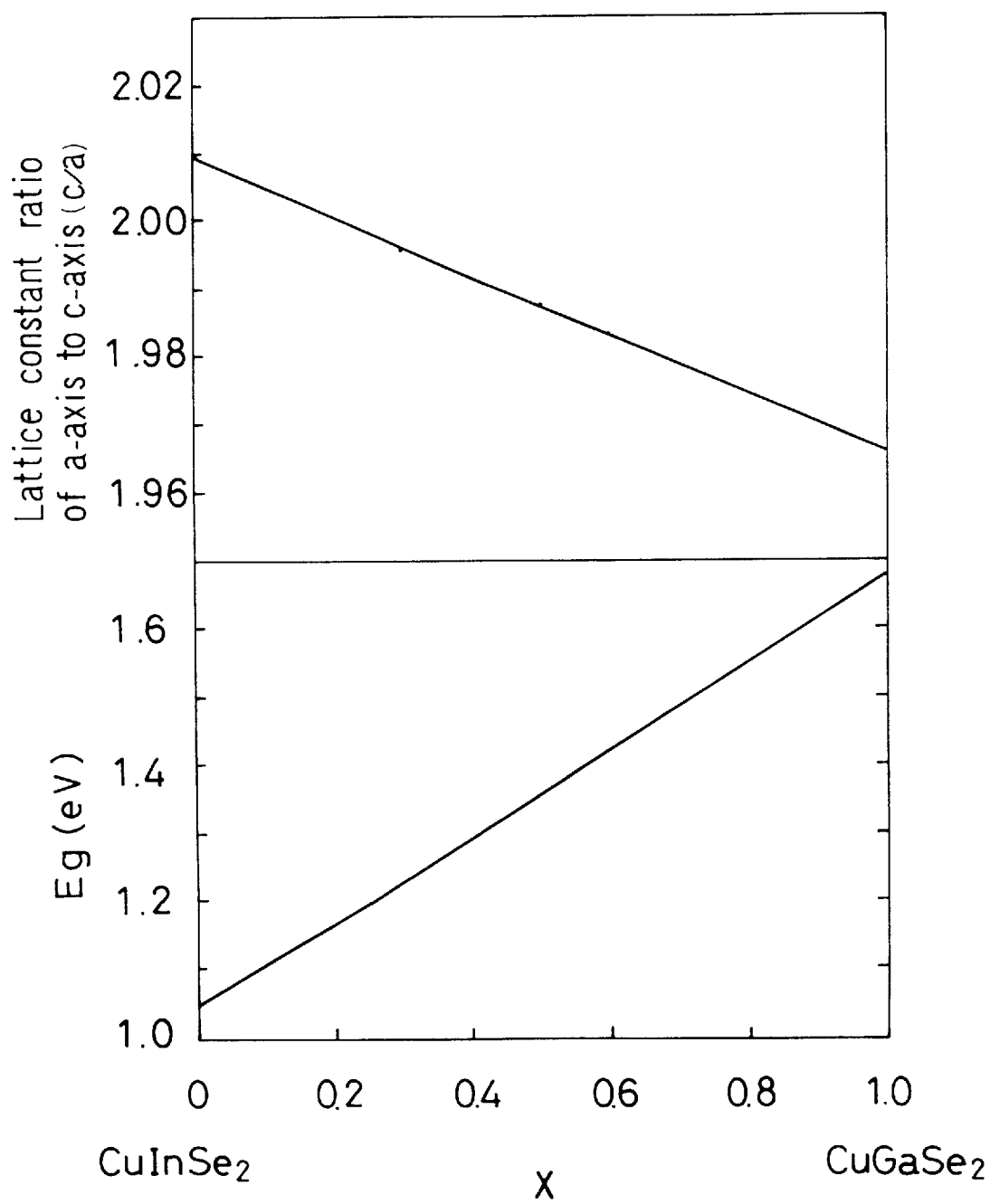
FIG. 6 is a graph showing the relationship between the band gap of the Cu(In$_{1-X}$Ga$_X$)Se$_2$ based solid solution of one embodiment and the lattice constant ratio of the a-axis to the c-axis (c/a).

It is clear from Table 1 that the c/a of $CuInSe_2$ is 2.0095. Therefore, if $CuGaSe_2$ having 1.9657 a/c is dissolved in the $CuInSe_2$, the band gap will be increased, and in addition, the c/a value will be closer to two. FIG. 6 shows the relationship between the band gap of the $Cu(In_{1-X}Ga_X)Se_2$ based solid solution and the value of c/a. Though the value of c/a becomes closer to two, the value begins to decrease when X exceeds 0.2. When X=0.2, the band gap is about 1.15 eV. Therefore, if this $Cu(In_{1-X}Ga_X)Se_2$ based solid solution is used as an absorber layer of a solar cell, the conversion efficiency becomes maximum when X ranges from 0.2 to 0.3. The conversion efficiency, however, does not rise even if more Ga is added.

In order to manufacture a $CuInSe_2$ based solar cell having high-conversion efficiency, its band gap should be increased while maintaining the c/a value of the $CuInSe_2$ based absorber layer at two. For such a purpose, a chalcopyrite type compound having a large band gap and high c/a value should be dissolved in the $Cu(In_{1-X}Ga_X)Se_2$. $CuInS_2$ is a compound to meet the requirement. Its band gap is as large as 1.53 eV and the c/a ratio exceeds two, more specifically, it is 2.0172. Therefore, the band gap can be increased while maintaining the c/a value at about two, by simultaneously dissolving $CuGaSe_2$ (its c/a value is less than two) and $CuInS_2$ (its c/a value is more than two) in the $CuInSe_2$. As a result, a desirable composition for an absorbing layer can be obtained, namely, where the composition is a $Cu(In_{1-X}Ga_X)(Se_{1-Y}S_Y)_2$ based solid solution of the formula:

$X=0.217+0.176Y$; where $1>X+Y>0$; and $1>Y>0$.

Table 2 shows the examples of absorber layer compositions which meet the above-mentioned requirements, and the band gaps.

TABLE 2

| X | Y | Eg(eV) |
|---|---|---|
| 0.783 | 0.000 | 1.15 |
| 0.665 | 0.100 | 1.21 |
| 0.547 | 0.200 | 1.28 |
| 0.430 | 0.300 | 1.34 |
| 0.312 | 0.400 | 1.41 |
| 0.195 | 0.500 | 1.47 |
| 0.077 | 0.600 | 1.54 |

In this condition, the band gap of the absorber layer can be controlled from 1.15 eV to 1.54 eV while maintaining the value of c/a at two. Actually however, it is difficult to control the composition of the $Cu(In_{1-X}Ga_X)(Se_{1-Y}S_Y)_2$ based solid solution to be exactly $X=0.217+0.176Y$, and the process is not desirable from the viewpoint of cost performance. The more practical composition is:

$0.317+0.176Y \geq X \geq 0.117+0.176Y$, $1>X+Y>0$, and $Y>0$.

Figure 7:
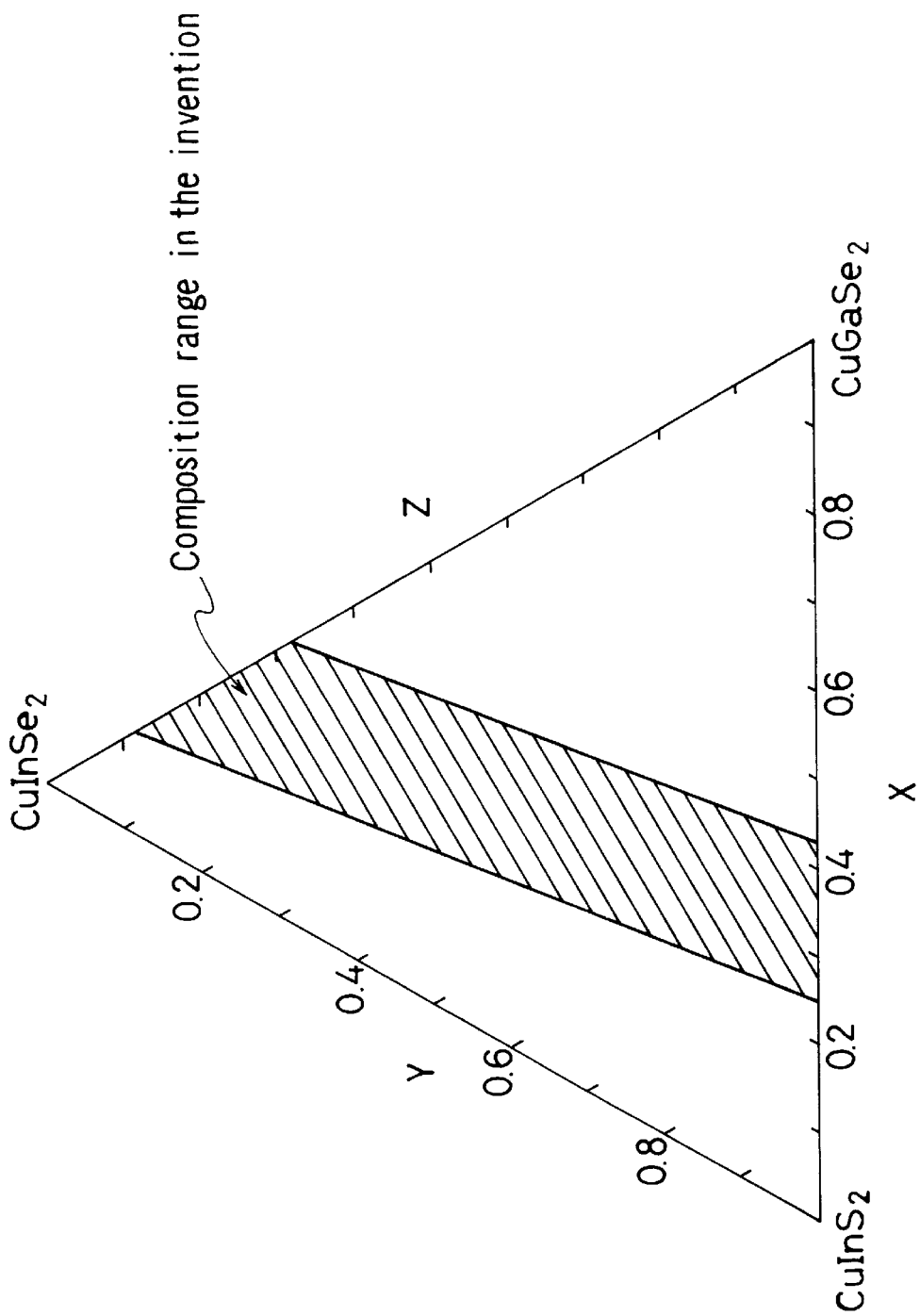
FIG. 7 is a graph showing the composition range of the Cu(In$_{1-X}$Ga$_X$)(Se$_{1-Y}$S$_Y$)$_2$ is based solid solution of one embodiment of this invention.

This composition is also indicated in FIG. 7. It is most desirable that the band gap is 1.4 eV, and X=0.3 while Y=0.4 in the composition of the $Cu(In_{1-X}Ga_X)(Se_{1-Y}S_Y)_2$ based solid solution, since the highest conversion efficiency will be provided for a homojunction solar cell. This invention will be described more in detail by referring to Examples.

EXAMPLE 1

A $Cu(In_{1-X}Ga_X)(Se_{1-Y}S_Y)_2$ based solid solution thin film was formed by a multi-source evaporation. The composition is indicated in Table 3. A soda-lime glass coated with an Mo film of about 1 μm thick was used for the substrate. Cu, In, Ga, Se, and S were evaporated from respective elemental sources. In the first step, the elements were deposited to be about 2 μm thick in a Cu-rich condition [Cu/(In+Ga)>1], and in the next step, the elements were deposited to be about 1 μm thick in a (In+Ga)-rich condition [Cu/(In+Ga)<1]. During this process, the temperature of the substrate was maintained at 540° C.

Table 3 shows the composition and the band gap of the $Cu(In_{1-X}Ga_X)(Se_{1-Y}S_Y)_2$ based solid solution thin film. The composition of the film was determined by using an electron probe microanalyzer (EPMA). A solar cell was manufactured using this $Cu(In_{1-X}Ga_X)(Se_{1-Y}S_Y)_2$ based solid solution thin film for its absorber layer. The solar cell has a structure of $MgF_2$/ITO/ZnO/CdS/CIGSSE/Mo/glass. Here, CIGSSE means $Cu(In_{1-X}Ga_X)(Se_{1-Y}S_Y)_2$. The CdS film was formed by a chemical bath, the ZnO film and the ITO film were formed by magnetron sputtering, and the $MgF_2$ antireflection film was formed by electron beam evaporation. Table 3 shows the conversion efficiency of the solar cells measured under the conditions of AM1.5, 100 mW/cm².

TABLE 3

| Number | X | Y | Eg(eV) | Conversion efficiency (%) |
|---|---|---|---|---|
| 1 | 0.20 | 0.00 | 1.14 | 14.8 |
| 2 | 0.23 | 0.12 | 1.22 | 16.7 |
| 3 | 0.25 | 0.20 | 1.27 | 17.2 |
| 4 | 0.26 | 0.28 | 1.33 | 18.3 |
| 5 | 0.28 | 0.40 | 1.41 | 19.0 |
| 6 | 0.30 | 0.50 | 1.48 | 18.2 |

It is clear from Table 3 that the conversion efficiency rises as the band gap comes closer to 1.4 eV. The cross-sections of the absorber layers of these solar cells were observed by using TEM. As a result, the crystal property was excellent, and neither twin crystals nor stacking faults were found.

EXAMPLE 2

A $Cu(In_{1-X}Ga_X)(Se_{1-Y}S_Y)_2$ based solid solution thin film was formed by a multi-source evaporation. A soda-lime glass coated with a Mo film of about 1 μm thick was used for the substrate. Cu, In, Ga, Se were evaporated from respective elemental sources, and S was evaporated from $In_2S_3$. In the first step, about 1 μm of In—Ga—Se—S film was formed while the substrate temperature was 300° C. Then, only the fluxes of Cu and Se were provided and film-forming was conducted until the composition of the whole film became Cu-rich [Cu/(In+Ga)>1]. During this process, the temperature of the substrate was raised to about 540° C. This film was subjected again to the fluxes of In, Ga, Se, and GaS in order to be applied to a solar cell, so that the final composition became (In, Ga)-rich [Cu/(In+Ga)<1]. Since the substrate temperature varies depending on the compositions, the compositions of the film were checked during the film-forming process by monitoring the substrate temperature, and thus the fluxes were changed properly (see *Japanese Journal of Applied Physics,* Kohara et al., Vol.34, L1141, 1995). Table 4 shows the composition of the formed $Cu(In_{1-X}Ga_X)(Se_{1-Y}S_Y)_2$ based solid solution thin films. The compositions of the films were determined by using an EPMA. The band gaps of the $Cu(In_{1-X}Ga_X)(Se_{1-Y}S_Y)_2$ based solid solution thin films are also shown in Table 4.

TABLE 4

| Number | X | Y | Eg(eV) | Conversion efficiency (%) |
|---|---|---|---|---|
| 7 | 0.21 | 0.02 | 1.15 | 15.6 |
| 8 | 0.22 | 0.05 | 1.17 | 16.4 |
| 9 | 0.23 | 0.10 | 1.21 | 16.7 |
| 10 | 0.24 | 0.14 | 1.23 | 17.0 |

The $Cu(In_{1-X}Ga_X)(Se_{1-Y}S_Y)_2$ based solid solution thin film was applied as an absorber layer to a solar cell having the identical structure as that of Example 1. The solar cell was measured under the same conditions as in Example 1. It is clear from Table 4 that the conversion efficiency rises as the band gap comes closer to 1.4 eV. The cross-sections of the absorber layers of these solar cells were observed by using TEM. As a result, the crystal property was excellent, and neither twin crystals nor stacking faults were found.

EXAMPLE 3

A $Cu(In_{1-X}Ga_X)(Se_{1-Y}S_Y)_2$ based solid solution thin film was formed by a multi-source evaporation. A soda-lime glass coated with an Mo film of about 1 μm thick was used for the substrate. Cu, In, Ga, Se were evaporated from respective elemental sources, and S was evaporated from GaS and elemental S. A Knudsen cell was used for the evaporation process. In the first step, about 1 μm of In—Ga—Se—S film was formed while the substrate temperature was 300° C. Then, only the fluxes of Cu, Se, and S were provided and film-forming was conducted until the composition of the whole film became Cu-rich [Cu/(In+Ga)>1]. During this process, the temperature of the substrate was raised to about 550° C. This film was subjected again to the fluxes of In, Ga, Se, and GaS in order to be applied to a solar cell, so that the final composition became (In, Ga)-rich [Cu/(In+Ga)<1]. Since the substrate temperature varies depending on the compositions, the compositions of the film were checked during the film-forming process by monitoring the substrate temperature, and thus the fluxes were changed properly. This $Cu(In_{1-X}Ga_X)(Se_{1-Y}S_Y)_2$ based solid solution thin film was applied as an absorber layer to manufacture a solar cell having the same structure as those of Examples 1 and 2. The conversion efficiency was as high as with the former examples. The cross-sections of the absorber layers of these solar cells were observed by using TEM. As a result, the crystal property was excellent, and neither twin crystals nor stacking faults were found.

As mentioned above, a solar cell of this invention has an absorber layer for photovoltaic energy conversion whose composition is indicated by the formula: $Cu(In_{1-X}Ga_X)(Se_{1-Y}S_Y)_2$ where X and Y are in the range of Equation (1). Therefore, the band gap can be controlled while maintaining its quality, and as a result, a solar cell having conversion efficiency superior to that of a conventional technique can be provided. In addition, the solar cell comprises an absorber layer of $Cu(In_{1-X}Ga_X)(Se_{1-Y}S_Y)_2$ based solid solution which has a chalcopyrite type crystal structure and whose lattice constant ratio of c-axis to a-axis is extremely close to two, so that the crystal property does not deteriorate even if the band gap of the absorber layer is enlarged.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A thin film solar cell comprising an absorber layer of $Cu(In_{1-X}Ga_X)(Se_{1-Y}S_Y)_2$ for photovoltaic energy conversion, where X and Y are in the range indicated by the following Equation (1):

$$0.317+0.176Y \geq X \geq 0.117+0.176Y \quad (1)$$

$$1 > X+Y > 0$$

$$Y > 0.$$

2. The thin film solar cell according to claim 1, wherein X and Y are in the range indicated by the following Equation (2):

$$X = 0.217+0.176Y \quad (2)$$

$$1 > X+Y > 0$$

$$Y > 0.$$

3. The thin film solar cell according to claim 1, where X=0.3 and Y=0.4.

4. The thin film solar cell according to claim 1, wherein the absorber layer of $Cu(In_{1-X}Ga_X)(Se_{1-Y}S_Y)_2$ has a chalcopyrite type crystal structure, wherein the lattice constant ratio of c-axis to a-axis is about two.

5. A method for manufacturing a thin film solar cell having an absorber layer of $Cu(In_{1-X}Ga_X)(Se_{1-Y}S_Y)_2$ for photovoltaic energy conversion, where X and Y are in the range of the following Equation (1), $$0.317+0.176Y \geq X \geq 0.117+0.176Y \quad (1)$$

$$1 > X+Y > 0$$

$$Y > 0,$$

and said absorber layer of $Cu(In_{1-X}Ga_X)(Se_{1-Y}S_Y)_2$ is formed by multi source evaporation of Cu, Ga, In, Se, and S.

6. A method for manufacturing a thin film solar cell having an absorber layer of $Cu(In_{1-X}Ga_X)(Se_{1-Y}S_Y)_2$ for photovoltaic energy conversion, where X and Y are in the range of Equation (1), $$0.317+0.176Y \geq X \geq 0.117+0.176Y \quad (1)$$

$$1 > X+Y > 0$$

$$Y > 0,$$

and said absorber layer of $Cu(In_{1-X}Ga_X)(Se_{1-Y}S_Y)_2$ is formed by multi source evaporation of Cu, Ga, In, Se, and an In sulfide.

7. The method for manufacturing a thin film solar cell according to claim 6, wherein the In sulfide is $In_2S_3$.

8. A method for manufacturing a thin film solar cell having an absorber layer of $Cu(In_{1-X}Ga_X)(Se_{1-Y}S_Y)_2$ for photovoltaic energy conversion, where X and Y are in the range of Equation (1), $$0.317+0.176Y \geq X \geq 0.117+0.176Y \quad (1)$$

$$1 > X+Y > 0$$

$$Y > 0,$$

and said absorber layer of $Cu(In_{1-X}Ga_X)(Se_{1-Y}S_Y)_2$ is formed by multi source evaporation of Cu, Ga, In, Se, and a Ga sulfide.

9. The method for manufacturing a thin film solar cell according to claim 8, wherein the Ga sulfide is GaS.

* * * * *